United States Patent
Silberman et al.

(10) Patent No.: US 8,476,953 B2
(45) Date of Patent: Jul. 2, 2013

(54) 3D INTEGRATED CIRCUIT STACK-WIDE SYNCHRONIZATION CIRCUIT

(75) Inventors: Joel A. Silberman, Somers, NY (US); Matthew R. Wordeman, Kula, HI (US)

(73) Assignee: International Business Machines Corporation, Armonk, NY (US)

( * ) Notice: Subject to any disclaimer, the term of this patent is extended or adjusted under 35 U.S.C. 154(b) by 99 days.

(21) Appl. No.: 13/217,767

(22) Filed: Aug. 25, 2011

(65) Prior Publication Data

US 2013/0049825 A1 Feb. 28, 2013

(51) Int. Cl.
*G06F 1/04* (2006.01)
*H03K 3/00* (2006.01)

(52) U.S. Cl.
USPC ........... 327/291; 327/293; 327/295; 327/403; 327/415

(58) Field of Classification Search
USPC ............................ 327/291, 293, 295, 403, 415
See application file for complete search history.

(56) References Cited

U.S. PATENT DOCUMENTS

| | | | |
|---|---|---|---|
| 4,868,712 A | 9/1989 | Woodman | |
| 5,200,631 A | 4/1993 | Austin et al. | |
| 5,280,184 A | 1/1994 | Jokerst et al. | |
| 5,655,290 A | 8/1997 | Moresco et al. | |
| 5,702,984 A | 12/1997 | Bertin et al. | |
| 6,141,245 A | 10/2000 | Bertin et al. | |
| 6,258,623 B1 | 7/2001 | Moden et al. | |
| 6,292,044 B1 * | 9/2001 | Mo et al. | 327/298 |
| 6,569,762 B2 | 5/2003 | Kong | |
| 6,982,869 B2 | 1/2006 | Larson | |
| 7,021,520 B2 | 4/2006 | Bowen | |
| 7,030,486 B1 | 4/2006 | Marshall | |
| 7,067,910 B2 | 6/2006 | Drost et al. | |
| 7,521,950 B2 | 4/2009 | Bernstein et al. | |
| 7,615,869 B2 | 11/2009 | Koo et al. | |
| 7,623,398 B2 | 11/2009 | Arai | |
| 7,701,251 B1 | 4/2010 | Rahman et al. | |
| 7,710,329 B2 | 5/2010 | Chiozzi | |
| 7,753,779 B2 | 7/2010 | Shayesteh | |

(Continued)

FOREIGN PATENT DOCUMENTS

FR 2946182 A1 12/2010

OTHER PUBLICATIONS

Badaroglu et al., "Clock-skew-optimization methodology for substrate-noise reduction with supply-current folding" ICCAD, vol. 25. No. 6, pp. 1146-1154, Jun. 2006.

(Continued)

*Primary Examiner* — John Poos
(74) *Attorney, Agent, or Firm* — Tutunjian & Bitetto, P.C.; Louis J. Percello (57) ABSTRACT

There is provided a synchronization circuit for a 3D chip stack having multiple circuits and multiple strata interconnected using a first and a second stack-wide broadcast connection chain. The synchronization circuit includes the following, on each stratum. A synchronizer connected to the first connection chain receives an asynchronous signal therefrom and performs a synchronization to provide a synchronous signal. A driver is connected to the second chain for driving the synchronous signal. A latch connected to the second chain receives the synchronous signal driven by the driver on a same or different stratum within a next clock cycle from the synchronization to provide the stack-wide synchronous signal to a circuit on a same stratum. An output of a single driver on one stratum is selected at any given time for use by the latch on all strata.

25 Claims, 3 Drawing Sheets

U.S. PATENT DOCUMENTS

| | | | |
|---|---|---|---|
| 7,768,790 B2 * | 8/2010 | Kuroda et al. | 361/760 |
| 7,772,708 B2 | 8/2010 | Leddige et al. | |
| 7,830,692 B2 | 11/2010 | Chung et al. | |
| 7,863,960 B2 * | 1/2011 | Wang et al. | 327/291 |
| 2002/0089831 A1 | 7/2002 | Forthun | |
| 2004/0177237 A1 | 9/2004 | Huppenthal et al. | |
| 2005/0058128 A1 | 3/2005 | Carson et al. | |
| 2006/0043598 A1 | 3/2006 | Kirby et al. | |
| 2007/0033562 A1 | 2/2007 | Correale et al. | |
| 2007/0047284 A1 | 3/2007 | Silvestri | |
| 2007/0132070 A1 | 6/2007 | Buot et al. | |
| 2007/0287224 A1 | 12/2007 | Alam et al. | |
| 2007/0290333 A1 | 12/2007 | Saini et al. | |
| 2008/0068039 A1 | 3/2008 | Bernstein et al. | |
| 2008/0204091 A1 | 8/2008 | Choo et al. | |
| 2009/0024789 A1 | 1/2009 | Rajan et al. | |
| 2009/0055789 A1 | 2/2009 | McIlrath | |
| 2009/0064058 A1 | 3/2009 | McIlrath | |
| 2009/0070549 A1 | 3/2009 | Solomon | |
| 2009/0070721 A1 | 3/2009 | Solomon | |
| 2009/0168860 A1 | 7/2009 | Magagni et al. | |
| 2009/0196312 A1 | 8/2009 | Kuroda | |
| 2009/0237970 A1 | 9/2009 | Chung | |
| 2009/0245445 A1 | 10/2009 | Saen et al. | |
| 2009/0323456 A1 | 12/2009 | Gomm | |
| 2010/0001379 A1 | 1/2010 | Lee et al. | |
| 2010/0005437 A1 | 1/2010 | McIlrath | |
| 2010/0044846 A1 | 2/2010 | Ohmi et al. | |
| 2010/0059869 A1 | 3/2010 | Kaskoun et al. | |
| 2010/0332193 A1 | 12/2010 | Hu et al. | |
| 2011/0016446 A1 | 1/2011 | Krebs | |
| 2011/0032130 A1 | 2/2011 | Ludwig | |
| 2011/0121811 A1 | 5/2011 | Dennard et al. | |

OTHER PUBLICATIONS

Chan et al., "A Resonant Global Clock Distribution for the Cell Broadband Engine Processor" IEEE J. Solid State Circuits, vol. 44, No. 1, pp. 64-72, Jan. 2009.

Gutnik et al., "Active GHz Clock Network Using Distributed PLLs" IEEE JSSC, vol. 35, No. 11, pp. 1553-1560, Nov. 2000.

Lam et al., "Power supply noise suppression via clock skew scheduling," in Proceedings of International Symposium on Quality Electronic Design, pp. 355-360, Mar. 2002.

Miura et al., "A 2.7Gb/s/mm2 0.9pj/b/Chip 1Coil/Channel ThruChip Interface with Coupled-Resonator-Based CDR for NAND Flash Memory Stacking," ISSCC, pp. 490-491, Feb. 2011.

Pavlidis et al., "Clock distribution networks for 3-D integrated Circuits", IEEE CICC, pp. 651-654, Sep. 2008.

Restle et al., "A Clock Distribution Method for Microprocessors", IEEE JSSC, vol. 36, No. 5, pp. 792-799, May 2001.

Tam et al., "Clock Generation and distribution for the first IA-64 Microprocessor", IEEE JSSC vol. 35, No. 11, pp. 1545-1552, Nov. 2000.

* cited by examiner

3D INTEGRATED CIRCUIT STACK-WIDE SYNCHRONIZATION CIRCUIT

CROSS-REFERENCE TO RELATED APPLICATIONS

This application is related to the following commonly assigned applications, all concurrently filed herewith and incorporated herein by reference: Ser. No. 13/217,734 entitled "PROGRAMMING THE BEHAVIOR OF INDIVIDUAL CHIPS OR STRATA IN A 3D STACK OF INTEGRATED CIRCUITS"; Ser. No. 13/217,335, entitled "SYNCHRONIZING GLOBAL CLOCKS IN 3D STACKS OF INTEGRATED CIRCUITS BY SHORTING THE CLOCK NETWORK"; Ser. No. 13/217,349, entitled "3D CHIP STACK SKEW REDUCTION WITH RESONANT CLOCK AND INDUCTIVE COUPLING" Ser. No. 13/217,789, entitled "CONFIGURATION OF CONNECTIONS IN A 3D STACK OF INTEGRATED CIRCUITS"; Ser. No. 13/217,381, entitled "3D INTER-STRATUM CONNECTIVITY ROBUSTNESS"; Ser. No. 13/217,406, entitled "AC SUPPLY NOISE REDUCTION IN A 3D STACK WITH VOLTAGE SENSING AND CLOCK SHIFTING"; and Ser. No. 13/217,429, entitled "VERTICAL POWER BUDGETING AND SHIFTING FOR 3D INTEGRATION".

BACKGROUND

1. Technical Field

The present invention relates generally to integrated circuits and, in particular, to a 3D integrated circuit stack-wide synchronization circuit.

2. Description of the Related Art

A three-dimensional (3D) stacked chip includes two or more electronic integrated circuit chips (referred to as strata or stratum) stacked one on top of the other. The strata are connected to each other with inter-strata interconnects that could use C4 or other technology, and the strata could include through-Silicon vias (TSVs) to connect from the active electronics on one side of the stratum to the opposite side of the stratum. The active electronics can be on the "front" or "back" side of the stratum.

In a 3D integrated stack, all strata may operate synchronously from a given clock source. For some operations, it is required that an asynchronous signal, originating outside of the stack, trigger a synchronized operation with all strata of the stack. A "strobe" and a "start" operation are examples of such operations. This synchronization must occur regardless of process or parameter or temperature or voltage variations across the stack.

SUMMARY

According to an aspect of the present principles, there is provided a stack-wide synchronization circuit for providing a stack-wide synchronous signal to each stratum of a 3D chip stack having multiple circuits and two or more strata interconnected using at least a first and a second connection chain. Each of the first and the second connection chains are in a stack-wide broadcast configuration. The stack-wide synchronization circuit includes the following, on each of the two or more strata. A synchronizer is connected to the first connection chain for receiving an asynchronous signal therefrom and performing a synchronization of the asynchronous signal to a clock signal to provide a synchronous signal with respect to the clock signal. A driver is connected to the second connection chain for driving the synchronous signal. A latch is connected to the second connection chain for receiving the synchronous signal driven by the driver on a same one or a different one of the two or more strata within a next clock cycle from the synchronization to provide the stack-wide synchronous signal to at least one of the multiple circuits on a same one of the two or more strata. The driver on each of the two or more strata is configured such that an output of a single driver on one of the two or more strata is selected at any given time for use by the latch on all of the two or more strata.

According to another aspect of the present principles, there is provided a method for providing a stack-wide synchronous signal to each stratum of a 3D chip stack having multiple circuits and two or more strata interconnected using at least a first and a second connection chain. Each of the first and the second connection chains are in a stack-wide broadcast configuration. The method includes providing the following on each of the two or more strata. A synchronizer is provided connected to the first connection chain and configured to receive an asynchronous signal therefrom and perform a synchronization of the asynchronous signal to a clock signal to provide a synchronous signal with respect to the clock signal. A driver is provided connected to the second connection chain and configured to drive the synchronous signal. A latch is provided connected to the second connection chain and configured to receive the synchronous signal driven by the driver on a same one or a different one of the two or more strata within a next clock cycle from the synchronization to provide the stack-wide synchronous signal to at least one of the multiple circuits on a same one of the two or more strata. The method further includes configuring the driver on each of the two or more strata such that an output of a single driver on one of the two or more strata is selected at any given time for use by the inter-strata receiver on all of the two or more strata.

According to yet another aspect of the present principles, there is provided a method for providing a stack-wide synchronous signal to each stratum of a 3D chip stack having multiple circuits and two or more strata interconnected using at least a first and a second connection chain. Each of the first and the second connection chains are in a stack-wide broadcast configuration. The method includes the following with respect to each of the two or more strata. An asynchronous signal is received. A synchronization is performed of the asynchronous signal to a clock signal to provide a synchronous signal with respect to the clock signal. The synchronous signal driven by the driver on a same one or a different one of the two or more strata is received. The synchronous signal is latched within a next clock cycle from the synchronization to provide the stack-wide synchronous signal to at least one of the multiple circuits on a same one of the two or more strata. The driver on each of the two or more strata is configured such that an output of a single driver on one of the two or more strata is selected at any given time to provide the synchronous signal on each of the two or more strata for said step of receiving the synchronous signal.

According to still another aspect of the present principles, there is provided a stack-wide synchronization circuit for synchronizing an asynchronous signal in each stratum of a 3D chip stack having two or more strata interconnected using at least a first and a second chain of vias. Each of the first and the second chain of vias are in a stack-wide broadcast configuration. The stack-wide synchronization circuit includes the following on each of the two or more strata. A first connection point is for receiving the asynchronous signal. An off-chip receiver has an input and an output, the input connected to the connection point. An asynchronous-to-synchronous signal converter has an input connected to an output of the off-chip receiver. A tri-state driver has a non-selection input connected an output of the asynchronous-to-synchronous signal converter. A second connection point is connected to an output of the tri-state driver. An inter-strata receiver has an input connected to the second connection point. A staging latch has an input connected to an output of the inter-strata receiver. The first connection point is connected to the first chain of vias and the second connection point is connected to the second chain of vias. The tri-state drivers are configured such that an output of a single tri-state driver on one of the two or more strata is selected at any given time. The output of the staging latch on each of the two or more strata provides a stack-wide synchronous signal during a given clock cycle responsive to a receipt of the asynchronous input signal by the first connection point on any of the two or more strata during an immediately preceding clock cycle with respect to the given clock cycle.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles are directed to a 3D integrated circuit stack-wide synchronization circuit. That is, the present principles provide a circuit configuration that provides a robust stack-wide synchronization function. Moreover, the present principles also provide a synchronization function when a single stratum is being tested prior to construction into a 3D stack.

Each stratum in the stack will include an off-chip receiver to receive an asynchronous input signal broadcast to all strata from off-chip. This asynchronous input signal will be synchronized on each stratum to the strata clock using known circuits. Stack configuration logic will designate one stratum as the synchronization master who will broadcast the synchronized signal to all strata where they are received within one clock cycle. This signal is then staged in each stratum resulting in stack-wide synchronization.

Figure 1:
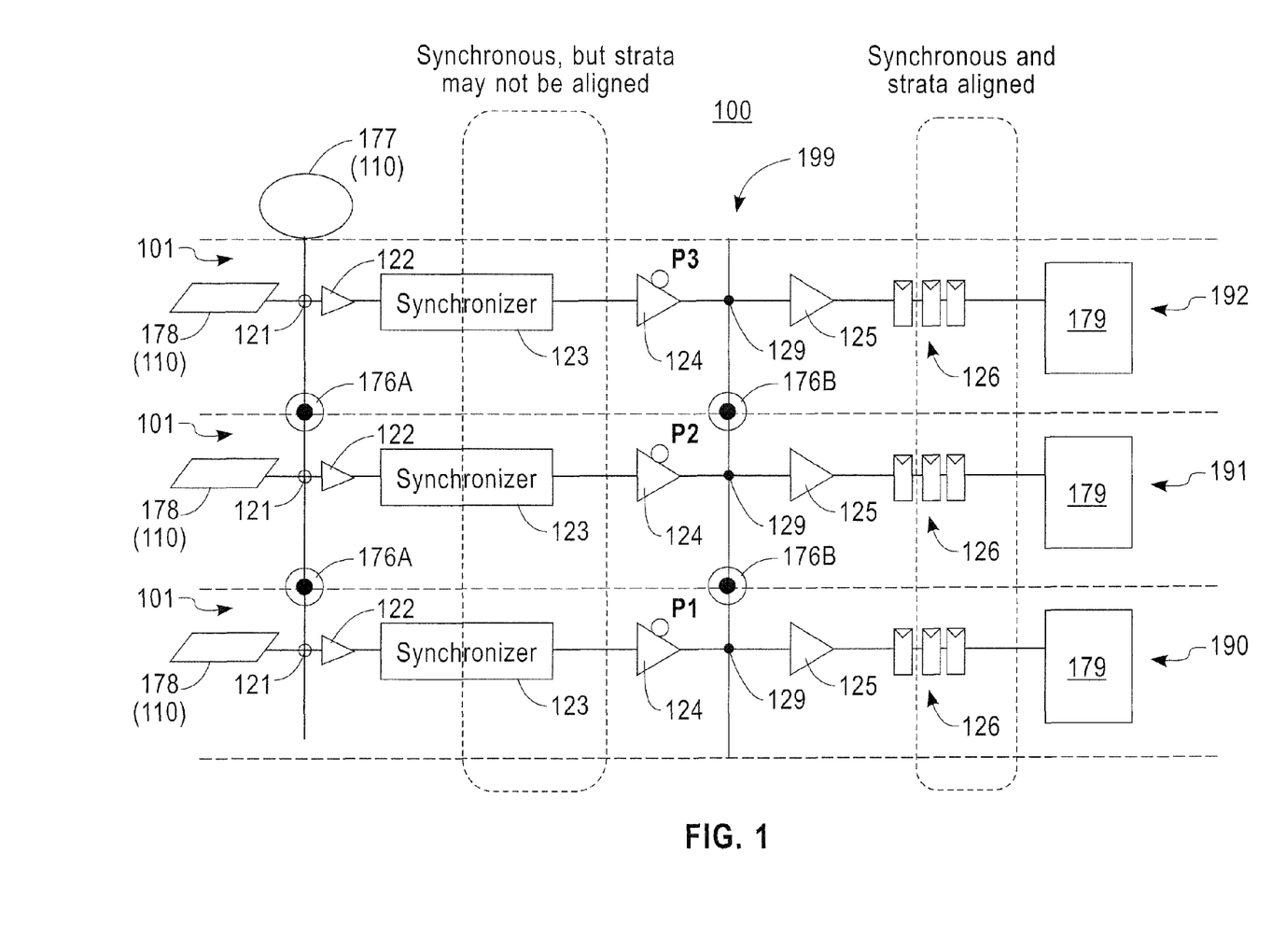
FIG. 1 shows a stack-wide synchronization circuit 100 for a 3D chip stack 199, in accordance with an embodiment of the present principles.

FIG. 1 shows a stack-wide synchronization circuit 100 for a 3D chip stack 199, in accordance with an embodiment of the present principles. Each stratum has an equivalent circuit portion 101 of the stack-wide synchronization circuit in order to provide stack-wide asynchronous to synchronous conversion.

The 3D chip stack 199 includes the following strata: a stratum 190; a stratum 191; and a stratum 192. Such strata may be interconnected using C4 connections (C4) 177 and through-and-through type through-Silicon vias (TSVs) 176A and 176B. Of course, other chip-to-chip interconnects may also be used, while maintaining the spirit of the present principles. Through-and-through type TSVs 176A and 176B are described in further detail in the aforementioned related application, namely Attorney Docket No. YOR920110388US1, entitled "Configuration of Connections in a 3D stack of Integrated Circuits".

The 3D chip stack 199 includes asynchronous input points 110. Such asynchronous input points 110 may include, for example, probe pads 178, and C4 connections 177. Moreover, such asynchronous input points 110 are inter-connected across the strata using the through-and-through TSVs 176A which can include one or more C4 connections 177.

The asynchronous input points 110 are also connected to a respective off-chip signal receiver 122 on each stratum. The off-chip receiver 122 on each stratum is part of a chain of elements on each stratum (and interconnected across the strata as described below) that enable the stack-wide synchronization described herein. Each off-chip signal receiver 122, in turn, is connected to an asynchronous-to-synchronous signal conversion circuit (hereinafter "synchronizer" for the sake of brevity) 123. Each synchronizer 123 may provide an amount of "de-bounce" for an asynchronous input signal, for example.

Further regarding the synchronizers 123, each of same receives the asynchronous input signal and a clock signal. Each synchronizer 123 then outputs a signal which has the signal value of the asynchronous input signal, but synchronized to the clock signal. That is, when the asynchronous input signal changes, then the output of each synchronizer 123 will change to the value of the changed asynchronous input signal, at a time that is related to an edge of the clock signal. Nonetheless, while the signals output from the synchronizers 123 are synchronous with respect to the clock signal, the outputs from the synchronizers 123 on different strata may be aligned to different clock pulses due to variations in the delay of the circuits on one stratum compared to another. Accordingly and advantageously, the present principles provide a way to synchronize these signals from the synchronizers 123 on a stack-wide-basis.

The stack-wide synchronization circuit 100 includes, on each of the strata, a probe pad 178, (at least two) connection points 121 and 129, portions (respective ends) of (at least two) through-and-through TSVs 176A and 176B and C4 connections 177, an off-chip receiver 122, a synchronizer 123, a programmable tri-state driver 124, and inter-strata input/output (I/O) receiver 125, and a staging latch 126.

For each stratum, the preceding elements are connected as follows. The probe pad 178 is connected to the connection point 121. The connection point 121 is also connected to an input of the off-chip receiver 122. An output of the off-chip receiver 122 is connected to an input of the synchronizer 123. An output of the synchronizer 123 is connected to an (non-selection) input of the tri-state driver 124. An output of the tri-state driver 124 is connected to the connection point 129. The connection point 129 is also connected to an input of the inter-strata receiver 125. An output of the inter-strata receiver 125 is connected to an input of the staging latch 126. An output of the staging latch 126 is connected to a pad or a circuit on that same stratum (with the pad or stratum represented by the reference numeral 179). Moreover, the connection point 121 is connected to a through-and-through TSV 176A and one or more C4 connections 177 placed and connected in an input broadcast configuration (so as to provide a broadcast or pass-through function throughout the stack 199 for the asynchronous input signal). Similarly the connection point 129 is connected to a through-and-through TSV 176B and one or more C4 connections 177 placed and connected in a broadcast configuration (so as to provide a broadcast or pass-through function throughout the stack 199 for the synchronous signal initially output from selected synchronizer 123). As noted above, this synchronous signal is synchronous to the clock signal provided to the synchronizer 123 for the purpose of synchronization thereto, but each the synchronous signals output from the synchronizers 123 may not be synchronous across the stack.

Regarding the tri-state driver 124, the same receives a stack configuration program bit (denoted as "P1", "P2", and "P3" in FIG. 1) via a selection input thereof. The tri-state driver 124 is sized, and the placement and wiring is adjusted such that a signal from the output of the synchronization circuit 123 on one stratum will reach the staging latch 126 on any other stratum in time to be received on the edge of the next clock signal on that (other) stratum. Once the system is programmed such that only one of the above tri-state drivers 124 is enabled, an asynchronous signal provided to the stack 199 (or to the input of a lone stratum) will cause a stack-wide synchronous rise of a signal at the output of the staging latch 126.

Stack configuration logic (not shown) will designate one stratum as the synchronization master that will broadcast the synchronized signal to all strata where the synchronized signal is received within one clock cycle. This signal is then staged by the staging latch 126 on each stratum resulting in stack-wide synchronization.

It is to be appreciated that the synchronization function can be provided to each single stratum separately when such single stratum is being tested prior to construction into a 3D stack (such as stack 199).

It is to be further appreciated that off-chip receiver 121 and inter-stratum receiver 125 are simply conventional receivers, but are capable of receiving off-chip provided signals (in the case of receiver 121) and inter-stratum provided signals (in the case of receiver 125) due to their respective configurations in the stack-wide synchronization circuit 100, as would be readily appreciated by one of ordinary skill in the art.

Figure 2:
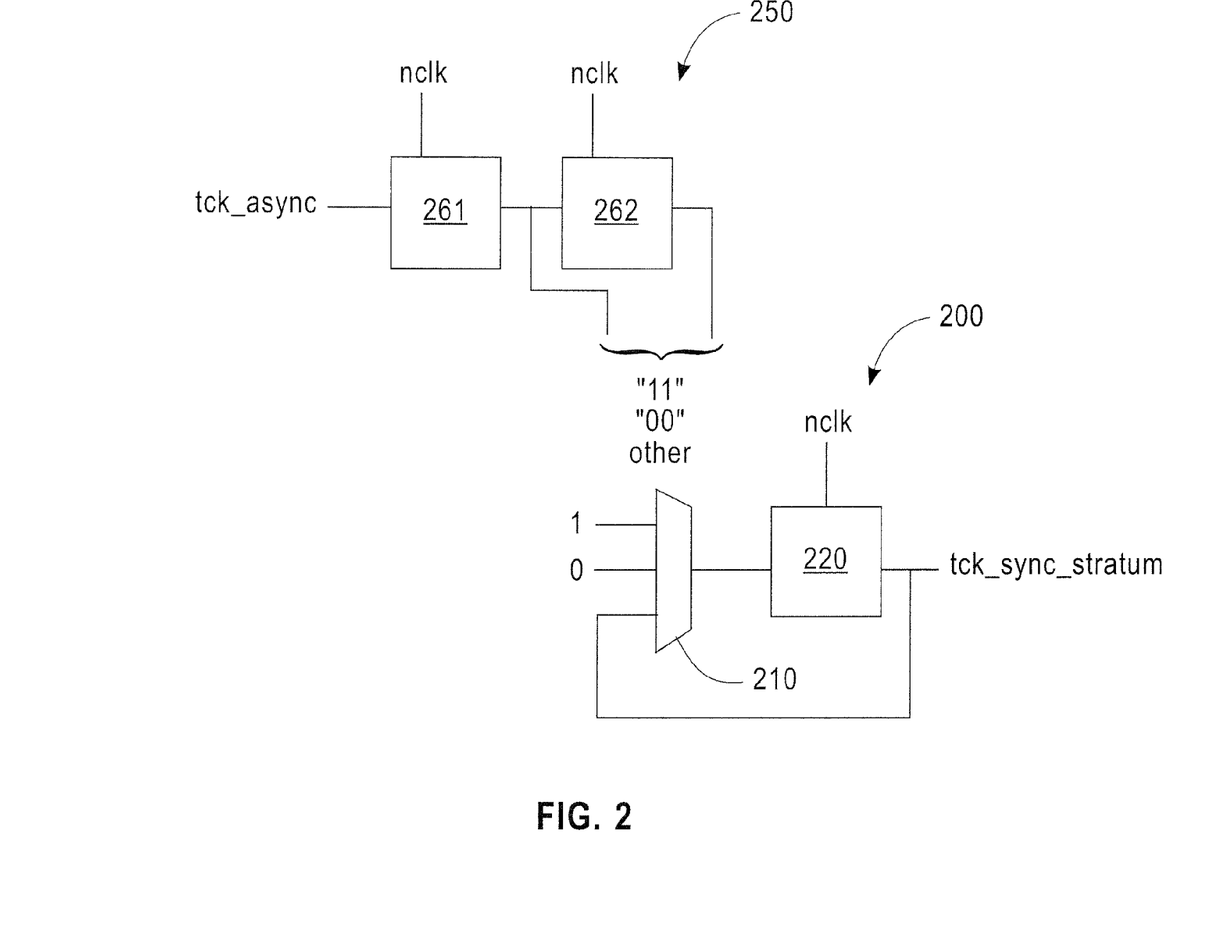
FIG. 2 further shows a synchronizer 200 and corresponding selection circuit 250 to which the present principles may be applied, in accordance with an embodiment of the present principles.

FIG. 2 further shows a synchronizer 200 and corresponding selection circuit 250 to which the present principles may be applied, in accordance with an embodiment of the present principles. The synchronizer 200 may be used for synchronizer 123 shown and described with respect to FIG. 1. However, it is to be appreciated that the present principles are not limited solely to using synchronizer 200, as other types and configurations of a synchronizer may also be readily used in accordance with the present principles, while maintaining the spirit of the present principles.

The synchronizer 200 includes a multiplexer 210 having three data inputs, two selection inputs, and an output. The output of the multiplexer 210 is connected to an input of a clock triggered latch 220. An output of the clock triggered latch 220 provides a synchronized signal (tck_sync_stratum) synchronized with a clock signal (nclk).

The selection input of the multiplexer 210 is provided a selection signal from a selection circuit 250. Of course, in other embodiments, a different selection circuit may be used. These and other variations are readily contemplated by one of ordinary skill in the art, while maintaining the spirit of the present principles. The selection circuit 250 includes a first clock triggered latch 261 and a second clock triggered latch 262 having an input connected to an output of the first clock triggered latch 261. The first clock triggered latch 261 receives an asynchronous signal (tck_async). The second clock triggered latch 262 receives the synchronous output of the first clock triggered latch 261. Hence, when the asynchronous input is at logic LO for two adjacent clock cycles, the outputs of both latches 261 and 262 will be '0'. This causes the multiplexer 210 to output a '0' which in turn will be captured in the latch 220 producing a clock synchronized '0' output as tck_sync_stratum. When the asynchronous input tck_async is at logic HI or '1' for two adjacent clock cycles, the outputs of both latches 261 and 262 will be '1'. This causes the multiplexer 210 to output a '1' which in turn will be captured in the latch 220 producing a clock synchronized '1' output as tck_sync_stratum. If the asynchronous input is changing from clock cycle to clock cycle, then the multiplexer 210 will cause the last value stored in the latch 220 to be held. Various perturbations of this circuits are possible. For example, more latches in the configuration of 261 and 262 may be added to provide more asynchronous noise rejection. Also, the operation of the multiplexer may be changed such that the tck_sync_stratum signal is a synchronous pulse that is output when an asynchronous rise or fall is detected.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc. or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

It is to be further appreciated that while one or more embodiments described herein may refer to the use of Silicon with respect to a chip or a through via, the present principles are not limited to using only chips or vias made from Silicon and, thus, chips or vias made from other materials including but not limited to Germanium and Gallium Arsenide may also be used in accordance with the present principles while maintaining the spirit of the present principles. Moreover, it is to be further appreciated that while one or more embodiments described herein may refer to the use of C4 or micro C4 (uC4) connections, the present principles are not limited to solely using C4 or micro C4 connections and, thus, other types of connections may also be used while maintaining the spirit of the present principles.

It is to be understood that the present invention will be described in terms of a given illustrative architecture having a wafer; however, other architectures, structures, substrate materials and process features and steps may be varied within the scope of the present invention.

It will also be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip of photovoltaic device may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 3:
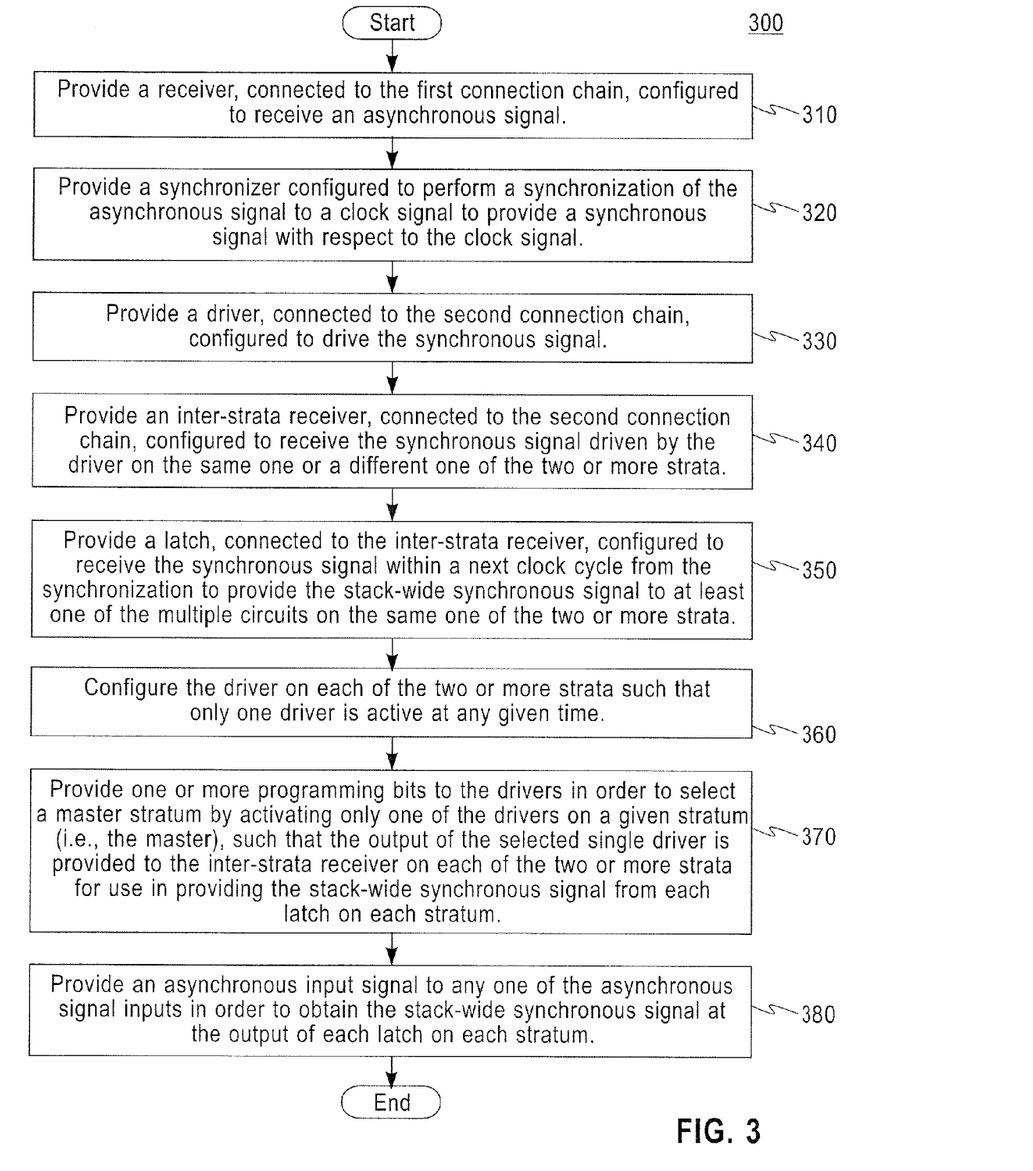
FIG. 3 shows a method 300 for providing a stack-wide synchronous signal in a 3D chip stack, in accordance with an embodiment of the present principles.

FIG. 3 shows a method 300 for providing a stack-wide synchronous signal in a 3D chip stack, in accordance with an embodiment of the present principles. By method 300, the stack-wide synchronous signal is provided to each stratum of a 3D chip stack having multiple circuits and two or more strata interconnected using at least a first and a second connection chain. Each of the first and the second connection chains is in a stack-wide broadcast configuration. Steps 310 through 370 are performed for each of the two or more strata.

At step 310, a receiver is provided, connected to the first connection chain, configured to receive an asynchronous signal.

At step 320, a synchronizer is provided configured to perform a synchronization of the asynchronous signal to a clock signal to provide a synchronous signal with respect to the clock signal.

At step 330, a driver is provided, connected to the second connection chain, configured to drive the synchronous signal.

At step 340, an inter-strata receiver is provided, connected to the second connection chain, configured to receive the synchronous signal driven by the driver on the same one or a different one of the two or more strata.

At step 350, a latch is provided, connected to the inter-strata receiver, configured to receive the synchronous signal within a next clock cycle from the synchronization to provide the stack-wide synchronous signal to at least one of the multiple circuits on the same one of the two or more strata.

At step 360, the driver on each of the two or more strata is configured such that the output of a single driver on one stratum is selected at any given time for use by the inter-strata receiver on all strata.

At step 370, one or more programming bits are provided to the drivers in order to select a master stratum by selecting only one of the drivers on a given one (i.e., the master) of the two or more strata, such that the output of the selected single driver is provided to the inter-strata receiver on each of the two or more strata for use in providing the stack-wide synchronous signal from each latch on each stratum.

At step 380, an asynchronous input signal is provided to any one of the asynchronous signal inputs in order to obtain the stack-wide synchronous signal at the output of each latch on each stratum.

This circuit is an element of a 3D IC and as such requires other 3D elements that are either known, or disclosed separately. In one embodiment, this can include inter-strata interconnections, both of the through and through type, and of the disjoint type. Of course, other types of connections performing the same functions may also be used, while maintaining the spirit of the present principles. Moreover, it is to be appreciated that the present principles could also be programmed by a system described separately that configures individual stratum in a 3D stack of integrated circuits. These and other variations and implementations of the present principles are readily ascertained from one of ordinary skill in the art given the teachings of the present principles provided herein, while maintaining the spirit of the present principles.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A stack-wide synchronization circuit for providing a stack-wide synchronous signal to each stratum of a 3D chip stack having multiple circuits and two or more strata interconnected using at least a first and a second connection chain, each of the first and the second connection chains being in a stack-wide broadcast configuration, the stack-wide synchronization circuit comprising, on each of the two or more strata:
   a synchronizer, connected to the first connection chain, for receiving an asynchronous signal therefrom and performing a synchronization of the asynchronous signal to a clock signal to provide a synchronous signal with respect to the clock signal;
   a driver, connected to the second connection chain, for driving the synchronous signal; and
   a latch, connected to the second connection chain, for receiving the synchronous signal driven by the driver on a same one or a different one of the two or more strata within a next clock cycle from the synchronization to provide the stack-wide synchronous signal to at least one of the multiple circuits on a same one of the two or more strata,
   wherein the driver on each of the two or more strata is configured such that an output of a single driver on one of the two or more strata is selected at any given time for use by the latch on all of the two or more strata.

2. The stack-wide synchronization circuit of claim 1, wherein the driver is a tri-state driver.

3. The stack-wide synchronization circuit of claim 1, wherein the driver is a multiplexer.

4. The stack-wide synchronization circuit of claim 1, wherein the driver on each of the two or more strata is responsive to one or more programming bits that specify the single selected driver.

5. The stack-wide synchronization circuit of claim 4, wherein the synchronous signal provided by only the single selected driver is used by the latch on each of the two or more strata to provide the stack-wide synchronous signal therefrom.

6. The stack-wide synchronization circuit of claim 1, further comprising asynchronous inputs, connected to the first connection chain on each of the two or more strata, for initially receiving the asynchronous signal into the 3D chip stack.

7. The stack-wide synchronization circuit of claim 1, wherein at least some of the asynchronous inputs are accessible externally with respect to the 3D chip stack.

8. The stack-wide synchronization circuit of claim 1, wherein the asynchronous inputs comprise at least one of input pads and C4 connections.

9. The stack-wide synchronization circuit of claim 1, wherein the clock signal is provided to each of the two or more strata.

10. The stack-wide synchronization circuit of claim 1, wherein the synchronizer, the driver, and the latch on the same one of the two or more strata are serially connected in a chain having as taps the first connection chain and the second connection chain.

11. The stack-wide synchronization circuit of claim 1, wherein the first connection chain comprises a plurality of through-and-through vias, each of the plurality of through-and-through vias having a front-side connection and a back-side connection co-located and connected to the front-side connection, the front-side connection being connected to the first connection point on same one of the two or more strata.

12. A method for providing a stack-wide synchronous signal to each stratum of a 3D chip stack having multiple circuits and two or more strata interconnected using at least a first and a second connection chain, each of the first and the second connection chains being in a stack-wide broadcast configuration, the method comprising:
providing on each of the two or more strata:
a synchronizer, connected to the first connection chain, configured to receive an asynchronous signal therefrom and perform a synchronization of the asynchronous signal to a clock signal to provide a synchronous signal with respect to the clock signal;
a driver, connected to the second connection chain, configured to drive the synchronous signal; and
a latch, connected to the second connection chain, configured to receive the synchronous signal driven by the driver on a same one of a different one of the two or more strata within a next clock cycle from the synchronization to provide the stack-wide synchronous signal to at least one of the multiple circuits on a same one of the two or more strata,
wherein the method comprises configuring the driver on each of the two or more strata such that an output of a single driver on one of the two or more strata is selected at any given time for use by the latch on all of the two or more strata.

13. The method of claim 12, wherein the driver is a tri-state driver.

14. The method of claim 12, wherein the driver is a multiplexer.

15. The method of claim 12, further comprising configuring the driver on each of the two or more strata to be responsive to one or more programming bits that specify the single selected driver.

16. The method of claim 15, wherein the synchronous signal provided by only the single selected driver is used by the latch on each of the two or more strata to provide the stack-wide synchronous signal therefrom.

17. The method of claim 12, further comprising providing asynchronous inputs, connected to the first connection chain, configured to initially receive the asynchronous signal into the 3D chip stack.

18. The method of claim 12, further comprising configuring at least some of the asynchronous inputs to be externally accessible with respect to the 3D chip stack.

19. The method of claim 12, wherein the asynchronous inputs comprise at least one of input pads and C4 connections.

20. The method of claim 12, further comprising providing the clock signal to each of the two or more strata.

21. The method of claim 12, wherein the synchronizer, the driver, and the latch on the same one of the two or more strata are serially connected in a chain having as taps the first connection chain and the second connection chain.

22. A method for providing a stack-wide synchronous signal to each stratum of a 3D chip stack having multiple circuits and two or more strata interconnected using at least a first and a second connection chain, each of the first and the second connection chains being in a stack-wide broadcast configuration, the method comprising:
with respect to each of the two or more strata:
receiving an asynchronous signal;
performing a synchronization of the asynchronous signal to a clock signal to provide a synchronous signal with respect to the clock signal;
receiving the synchronous signal driven by a driver on a same one or a different one of the two or more strata; and
latching the synchronous signal within a next clock cycle from the synchronization to provide the stack-wide synchronous signal to at least one of the multiple circuits on a same one of the two or more strata,
wherein a driver is provided on each of the two or more strata and is configured such that an output of a single driver on one of the two or more strata is selected at any given time to provide the synchronous signal on each of the two or more strata for said step of receiving the synchronous signal.

23. The method of claim 22, wherein the driver on each of the two or more strata is responsive to one or more programming bits that specify the single selected driver.

24. A stack-wide synchronization circuit for synchronizing an asynchronous signal in each stratum of a 3D chip stack having two or more strata interconnected using at least a first and a second chain of vias, each of the first and the second chain of vias being in a stack-wide broadcast configuration, the stack-wide synchronization circuit comprising, on each of the two or more strata:
a first connection point for receiving the asynchronous signal;
an off-chip receiver having an input and an output, the input connected to the connection point;
an asynchronous-to-synchronous signal converter having an input connected to an output of the off-chip receiver;
a tri-state driver having a non-selection input connected an output of the asynchronous-to-synchronous signal converter;
a second connection point, connected to an output of the tri-state driver;
an inter-strata receiver having an input connected to the second connection point; and
a staging latch having an input connected to an output of the inter-strata receiver,
wherein the first connection point is connected to the first chain of vias and the second connection point is connected to the second chain of vias, the tri-state drivers are configured such that an output of a single tri-state driver on one of the two or more strata is selected at any given time, and wherein the output of the staging latch on each of the two or more strata provides a stack-wide synchronous signal during a given clock cycle responsive to a receipt of the asynchronous input signal by the first connection point on any of the two or more strata during an immediately preceding clock cycle with respect to the given clock cycle.

25. The stack-wide synchronization circuit of claim 24, wherein the driver on each of the two or more strata is responsive to one or more programming bits that specify the single selected driver.

* * * * *